(12) United States Patent
Covell

(10) Patent No.: US 7,989,229 B2
(45) Date of Patent: Aug. 2, 2011

(54) TACTILE SURFACE INSPECTION DURING DEVICE FABRICATION OR ASSEMBLY

(75) Inventor: James H. Covell, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 367 days.

(21) Appl. No.: 11/852,493

(22) Filed: Sep. 10, 2007

(65) Prior Publication Data

US 2009/0068770 A1 Mar. 12, 2009

(51) Int. Cl.
*G01R 31/26* (2006.01)

(52) U.S. Cl. .......................... 438/14; 438/18

(58) Field of Classification Search .................. None
See application file for complete search history.

(56) References Cited

U.S. PATENT DOCUMENTS

| | | | |
|---|---|---|---|
| 5,420,796 A * | 5/1995 | Weling et al. | 438/5 |
| 5,912,507 A * | 6/1999 | Dunn et al. | 257/767 |
| 5,965,880 A | 10/1999 | Wolf et al. | |
| 5,983,725 A | 11/1999 | Fischer et al. | |
| 6,333,209 B1 | 12/2001 | Coico et al. | |
| 6,706,479 B2 | 3/2004 | Saraf et al. | |
| 6,777,821 B2 | 8/2004 | Primrose | |
| 7,205,646 B2 | 4/2007 | Lin et al. | |
| 2003/0047675 A1* | 3/2003 | Proksch et al. | 250/234 |
| 2006/0277981 A1* | 12/2006 | Ohta et al. | 73/105 |

OTHER PUBLICATIONS

Ji et al. "Evaluation of Microstructure and Stress of Cu Damascene Interconnects Using SPM", Proc. 23rd International Conference on Microelectronics (MIEL 2002), vol. 2, p. 781-783).*
Park et al. "AFM Studies of Deformation and Interfacial Sliding in Interconnect Structures in Microelectronic Devices", Mat. Res. Soc. Symp. Proc. vol. 766 2003.*
Quirk et al. "Atomic Force Microscopy (AFM)," Semiconductor Manufacturing Technology, Prentice-Hall, Inc., 2001, p. 173-174.*
Zhong et al. "Measurements of surface deformations and strains using an AFM moire method," Measurements 38 (2005) 34-41.*
Maheshwari, Vivek et al., "High-Resolution Thin-Film Device to Sense Texture by Touch", Science, Jun. 9, 2006 vol. 312, No. 5779, pp. 1501-1504.

* cited by examiner

*Primary Examiner* — Matthew Smith
*Assistant Examiner* — Shaka Scarlett
(74) *Attorney, Agent, or Firm* — Cantor Colburn LLP; Yuanmin Cai

(57) ABSTRACT

Processes for inspecting a surface during device fabrication include contacting the surface with a tactile sensor. The tactile sensor is an electroluminescent tactile sensor array or a current electrode sensor array or a capacitive sensor array. The sensor is configured to convert local stress resulting from contact with the surface into light intensity and/or modulation in local current density. Both the light intensity and current density are linearly proportional to the local stress. The image stress provided by the sensor can then be captured by focusing the light intensity onto a suitable detector to provide a topographical image of the surface. Current density can alternatively be directly sensed via high resolution electrode array.

22 Claims, 3 Drawing Sheets

ELECTROLUMINESCENT SIDE

TACTILE SURFACE INSPECTION DURING DEVICE FABRICATION OR ASSEMBLY

BACKGROUND OF THE INVENTION

1. Field of the Invention

This invention relates to a tactile array or planar or other surface inspection or registration during device fabrication and assembly.

2. Description of Background

Surface mounted semiconductor devices and carrier packages require a co-planar array of power and signal interconnect features, e.g., column grid array, ball grid array, C4 array, spring loaded contact array or pad array to make electrical connection with the corresponding circuits in the board, substrate, or interposer used to process the appropriate signal. For example, a ball grid array (BGA) is a design of semiconductor device that includes an array of discrete conductive elements in the form of conductive balls, or bumps, disposed on a surface of the semiconductor device to be mounted to a carrier substrate. The array of discrete conductive elements is aligned with a mating array of conductive terminal pads formed on the carrier substrate, such as a printed circuit board. After proper alignment, the discrete conductive elements are electrically connected to the terminal pads. Heat is applied to reflow the solder balls (bumps) to form the electrical connections between the carrier substrate and the semiconductor device contained in the package and the substrate.

The electrical and mechanical connections are one of the most critical elements of any interconnect array package structure. If the device is misaligned with respect to the carrier substrate and terminal pads, one or more of the discrete conductive elements of the array may not make sufficient contact with the corresponding terminals pad(s). Likewise, if the discrete conductive elements are irregular and/or defective in any manner, sufficient contact may not result. This, of course, may result in an inoperative or unreliable circuit. Present methods of interconnect array manufacturing and assembly utilize optical and laser based inspection methods. Often there are limited standoff heights and overhang restrictions due to the body of the package. These optical methods and the associated apparatus employed are relatively expensive and prone to false positives and negatives due to lighting, finish, reflectivity, and color variations in the interconnect feature surface to be analyzed.

Accordingly, there is a need for alternative technologies that are relatively less expensive, and less prone to false negatives and positives. Additionally there is a need for non-optical methods of inspection of a planar surface such as, for example, inspection of the heat sink attachment plane or die mounting surface for presence of surface flatness, parallelism, and/or particulate contamination.

SUMMARY OF THE INVENTION

Exemplary embodiments include a method for inspecting planarity and/or periodicity of an interconnect array surface. One such method comprises contacting the interconnect array surface with a high resolution tactile sensor; forming a topographical image of the array surface; and inspecting planarity and/or periodicity of the interconnect array surface.

In another embodiment, a method for aligning a surface mounted package onto a substrate is disclosed. The method comprises contacting a surface of the surface mounted package with a high resolution tactile sensor, wherein the surface comprises at least one solder bump; mapping the surface of the surface mounted package; contacting a surface of a substrate with a high resolution tactile sensor, wherein the surface comprises at least one pad; mapping the surface of the substrate; and aligning the at least one solder bump of the surface mounted package with the at least one pad of the substrate.

Further exemplary embodiments include a method for inspecting a surface during device manufacture. The method comprises contacting the surface with a tactile electroluminescent sensor array; and capturing variations in electroluminescent and/or electrical signal intensity as a function of localized stress caused by contacting the surface with the tactile electroluminescent sensor array, wherein the variations provide topographical surface information.

Additional exemplary embodiments for inspecting a surface during device manufacture comprise contacting the surface with a current sensing electrode tactile sensor array; and capturing variations in current as a function of localized stress caused by contacting the surface with current sensing electrode tactile sensor array, wherein the variations provide topographical surface information.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

The present invention provides a tactile process for inspecting a surface, such as a interconnect array, regardless of optical, illumination, and surface finish variations present thereon. The process generally utilizes a tactile sensor that contacts the desired surface to be inspected, whereby a topographical image of the surface can be optically or electrically translated via a detector. Suitable tactile sensors include, without limitation electroluminescent tactile sensors and electrode tactile sensors. For device manufacturers, the process can be utilized to verify co-planarity and periodicity during device manufacture or at point of use during assembly using these tactile sensors. In this manner, interconnect array parameters such as seating plane, spacing, and array position can be obtained.

In one embodiment, the tactile electroluminescent sensor array includes an electroluminescent film that is generally configured as a capacitor structure that utilizes a luminescent material (e.g., phosphor particles) sandwiched between electrodes, at least one of which is transparent to allow light to escape. Application of a voltage across the electrodes generates a changing electric field within the luminescent material that causes it to emit light. In the present invention, the electroluminescent tactile sensor array is configured to convert local stress into electroluminescent light intensity and modulation in local current density. Both the electroluminescence intensity and current density are linearly proportional to the local stress. The image stress provided by the electroluminescent film can then be captured by focusing the electroluminescent light intensity onto a suitable detector, e.g., a charge coupled device (CCD), so as to provide the topographical image of the surface. Suitable tactile electroluminescent sensor arrays are described in the Vivek Maheshwari and Ravi F. Saraf's article entitled, "High resolution Thin Film Device to Sense Texture by Touch", Science 9, June 2006, Vol. 312, no. 5779, pp. 1501-1504, incorporated herein by reference in their entirety.

Figure 1:
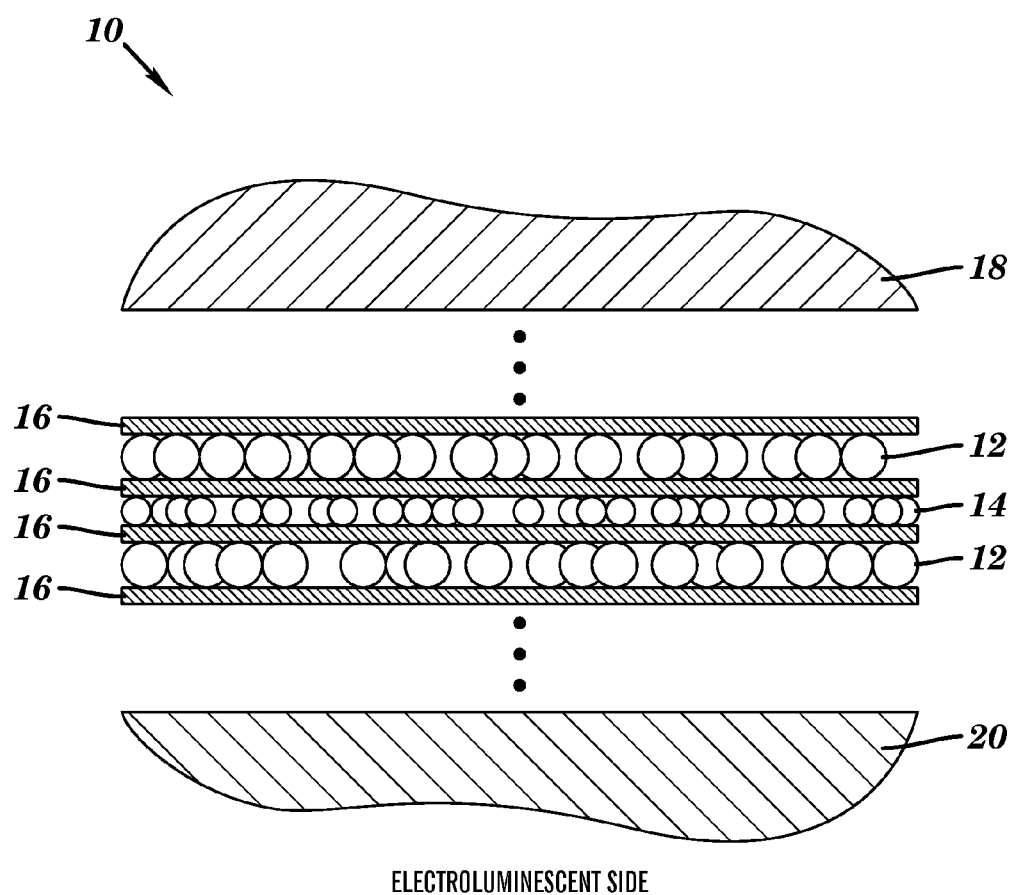
FIG. 1 illustrates a cross section of an exemplary tactile device suitable for practicing the invention.

FIG. 1 provides a schematic of an exemplary tactile electroluminescent sensor array 10. The device 10 includes alternating layers of gold (Au) and cadmium sulfide (CdS) nanoparticles 12, 14, respectively, that are separated by dielectric layers 16. By way of example, the Au nanoparticles are preferably on average 10 nanometers in diameter and the CdS nanoparticles are on average 3 to 4 nm in diameter. The dielectric layers can be composed of stacked alternating layers of poly(styrene sulfonate) (PSS) and poly(allylamine hydrochloride) (PAH). The particular device described here has three Au layers and two CdS layers, with four layers each of PAH and PSS as the interlying dielectric layer. The top gold electrode is coated with flexible plastic layer 18 and the bottom layer 20 is formed of transparent indium tin oxide (ITO) on glass. In the vertical direction, the film is conducting due to a tunneling effect between the Au and CdS layers. As such, electroluminescence can only occur when tunneling through the CdS layer occurs. All of the monolayers of polymer and nanoparticles can be deposited from solution using layer-by-layer self-assembly. Moreover, as noted above, resistance decreases linearly as a function of the amount of compressive stress.

The alternating monolayers of Au and CdS nanoparticles, spaced by a dielectric layer composed of PSS and PAH, can be deposited using a layer by-layer assembly process by sequentially dipping in four solutions: The 0.1% (by weight) solutions of PSS and PAH of molecular weights 70 and 15 kD have a pH of 8 and 4.2, respectively. The anionic Au and CdS deposition solutions with $10^{12}$ and $10^{16}$ particles/ml have a pH of 6 and 4.5, respectively. The deposition time for the polymer monolayer is 30 min each; for the Au and cationic CdS nanoparticles, it is 24 hours and 1 hour, respectively. All the solutions are in deionized water (filtered through 20μ Millipore filter), and each deposition step is followed by a rigorous wash in deionized water. The chemical structure of dielectric layer between the Au and CdS nanoparticle monolayers is as follows: Au nanoparticle layer/PAH/(PSS/PAH)$_3$/PSS/CdS nanoparticle layer. The process is initiated by cleaning the 1-inch by 1-inch ITO-coated (400 nm) glass surface in piranha solution ($H_2SO_4/H_2O_2$; 3:1 by volume) to make the electrode surface negatively charged. The final structure of the device is glass/ITO/dielectric layer/[Au layer/dielectric layer/CdS layer/dielectric layer]$_2$/Au layer/dielectric layer/Au-electrode/plastic. The structure of the flexible electrode is Au (200 nm)/Cr (70 nm)/Al (12 μm)/siloxane rubber (approximately 5 μm). The Au is sputter-deposited on the Al foil with Cr as the adhesion layer. Poly(dimethyl siloxane) is spincast on the other side for the electrode, followed by UV cross-linking. The resultant freestanding electrode is physically placed on the device with the Au side in physical contact with the device surface. Optionally, the film and the nanoparticle matrix are mounted to a glass plate.

Advantageously, the tactile electroluminescent sensor array 10 can provide vertical resolution up to about 10 microns and lateral resolution up to about 20 to 40 microns. The force is configurable from about 10 to about 40 Kpa. In addition, the above tactile electroluminescent sensor array 10 can be configured to image approximately a 25 millimeter square, which is expandable for different applications.

Figure 2:
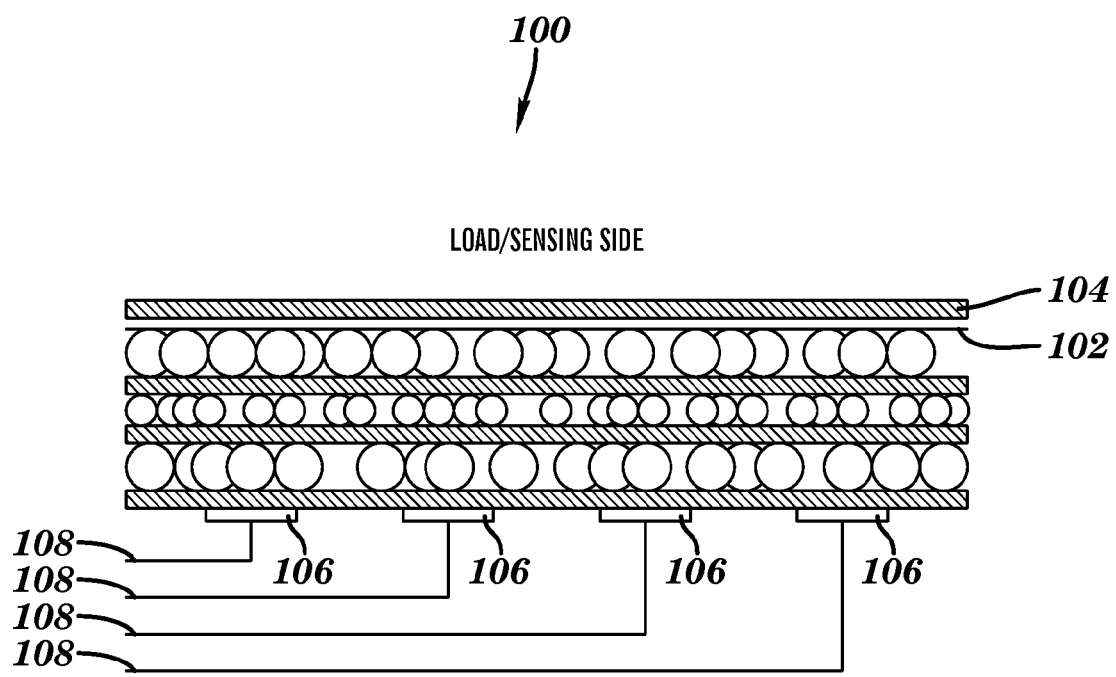
FIG. 2 illustrates an exemplary ball grid array.

FIG. 2 illustrates an electrode based tactile sensor, generally designated by reference numeral 100. The structure 100 includes a conductive film 102 (bias voltage plane), e.g., gold, is disposed on the load sensing side of a plastic sheet material 104. Discrete electrode arrays 106 e.g., gold, with signal lines 108 are disposed on a dielectric sheet material 16 as shown. Alternating layers of Au and CdS nanoparticles 12, 14, respectively, that are separated by dielectric layers 16 in the manner previously described are sandwiched between the gold film and discrete electrode arrays. In this embodiment, compressive strain is directly proportional to a change in resistance.

In a related implementation, the electrode tactile sensor generally could include a pair of spaced part electrodes. Capacitance of the electrical charge stored between two electrodes is measured upon contact with the surface. As the electrodes are moved closer to or farther from one another, the air gap changes, and therefore so does the capacitance. As such, the amount of compressive strain is directly proportional to the change in capacitance.

Ball grid arrays are generally a surface-mount package that utilizes an array of metal spheres or balls as the means of providing external electrical interconnection. The balls are composed of solder, and are attached to a substrate such as a pointed circuit board. The die of the BGA is connected to the substrate either by wirebonding or flip chip connection. The substrate of a BGA has internal conductive traces that route and connect the die-to-substrate bonds to the substrate-to-ball array bonds. The tactile process can be used to verify coplanarity of the respective surfaces during assembly as well as define parameters such as seating plane, spacing, and array position.

Figure 3:
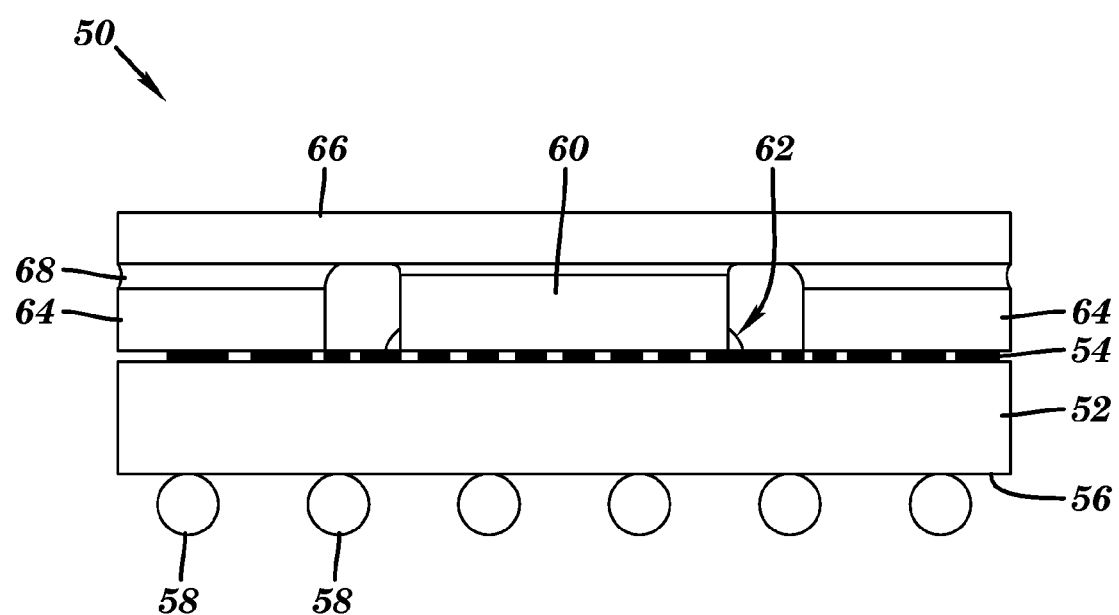
FIG. 3 illustrates an exemplary electrode based tactile sensor.

FIG. 3 illustrates an exemplary ball grid array, which in this case is a flip chip ball grid array. The flip chip ball grid array 50 includes a substrate 52 having top and bottom substantially planar surfaces 54, 56, respectively. On the bottom surface 56, one or more solder bumps (balls) 58 are disposed to provide electrical interconnection with a substrate (not shown), e.g., a printed circuit board. A flip chip die 60 is aligned and soldered to substrate 52 using a eutectic soldering process. Underfill material 62 is provided thereafter. Stiffeners 64 are provided and the flip chip die is encapsulated. A heat sink or coverplate 66 is applied on the top of the assembly using a thermal adhesive 68.

The tactile sensor array can be utilized to inspect the surface of the flip chip die 60 as well as the top and bottom surfaces 54, 56, respectively, of the substrate 52. For example, the tactile sensor array can be utilized to verify coplanarity. Variation in the bumps in the ball grid array can be larger than allowable specification. This can cause coplanarity issues during assembly. Moreover, a bump that is marginally smaller or (flattened/damaged) than the other bumps in the array may not form a proper solder joint, resulting in an open or unreliable connection after reflow.

This type of defect is typically detected by optical means, at the time of device fabrication or at assembly to the next level (i.e., chip carrier BGA connection to a circuit board). This method is prone to optically related false calls due to variations in lighting or surface reflectivity. Although this type of defect may be detected by optical inspection such as by x-ray, after reflow has occurred. The repair would then require reworking the entire component.

During operation with an electroluminescent tactile sensor, the flexible gold electrode portion (i.e., flexible plastic layer 20 and gold nanoparticles 12) is contacted against the particular interlayer array surface to be examined. Electroluminescence is then measured as a function of the bias due to the compressive strain. The electroluminescent image can be reviewed with direct observation or with a charged couple device (CCD) image analyzer or a CCD array on the film backing. The CCD detector can provide the on-off state of the sensor luminescence. Missing low, high, or oversized features would be evident by the presence, absence and surface area of the resulting illuminated pattern features. Alternatively, the tactile sensor utilizing an integral high resolution electrode array would directly couple the tunneling current to detection electronics. An electrode tactile sensor would function in a similar manner and provide current variation as a function of the bias due to the compressive strain.

Advantageously, the tactile sensors can be integrated with existing placement tooling functions. For example, the tactile sensor array can be integrated with robots to manipulate the position of the interconnect array relative to the substrate, e.g., printed circuit board. Generally, the robot includes a robotic arm that picks up the electrical component from a feeder for placement on the circuit board. The robotic arm can be configured to contact the electrical component with the tactile sensor such that a topographical image is obtained. The captured image is then analyzed and feedback given to the robotic arm to provide fine positional adjustment placement of the electrical component onto the circuit board. Additionally, the tactile sensor array can be utilized for heat sink mounting surfaces, as well as verifying surface defect and/or contamination. Array X,Y planarity inspection at fabrication, array inspection prior to next level assembly, array registration relative to package outline, array registration for placement alignment, surface inspection for heatsink or other planar component attachment.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A process for inspecting planarity and/or periodicity of an interconnect array surface, comprising:
   contacting the interconnect array surface with a tactile sensor;
   forming a topographical image of the array surface, wherein forming the topographical image comprises capturing light intensity variations generated by the tactile sensor across the interconnect array surface, wherein the light intensity variations are a function of compressive localized stress, and wherein the light intensity variations are linearly proportional to the local stress; and
   inspecting planarity and/or periodicity of the interconnect array surface.

2. The process of claim 1, wherein the tactile sensor comprises an electro luminescent device.

3. The process of claim 1, wherein the tactile sensor is an electroluminescent tactile sensor array.

4. The process of Claim 1, wherein the interconnect array surface comprises a spring loaded contact array.

5. The process of claim 1, wherein the interconnect array surface comprises a ball grid array, a C4 array, a column grid array or a pad array.

6. The process of claim 1, further comprising determining missing, low, high or oversized features from the topographical image.

7. A process for aligning a surface mounted package onto a substrate, the process comprising:
   contacting a surface of the surface mounted package with a tactile sensor, wherein the surface comprises at least one solder bump;
   mapping the surface of the surface mounted package;
   contacting a surface of a substrate with a tactile sensor, wherein the surface comprises at least one pad;
   mapping the surface of the substrate, wherein mapping the surfaces is selected from the group consisting of capturing electrical signal intensity variations generated by the tactile sensor across the surfaces, wherein the variations are a function of compressive localized stress, wherein the electrical signal intensity variations are linearly proportional to the local stress and capturing light intensity variations generated by the tactile sensor across the surfaces, wherein the variations are a function of com ressive localized stress wherein the light intensit variations are linearly proportional to the local stress; and
   aligning the at least one solder bump of the surface mounted package with the at least one pad of the substrate.

8. The process of claim 7, wherein the tactile sensor comprises an electroluminescent device.

9. The process of claim 7, wherein the substrate is a printed circuit board.

10. The process of claim 7, wherein the surface mounted package comprises a ball grid array, a flip chip die ball grid array, a C4 array, or a column grid array.

11. The process of claim 7, further comprising integrating information obtained during the mapping with a robot and manipulating a position of the surface mounted package relative to the substrate.

12. The process of claim 7, wherein the tactile sensor comprises a current sensing electrode tactile sensor array.

13. A process for inspecting a surface during device manufacture, the process comprising:
   contacting the surface with a tactile electroluminescent sensor array; and
   capturing variations in electroluminescent and/or electrical signal intensity as a function of localized stress caused by contacting the surface with the tactile electroluminescent sensor array, wherein the variations provide topographical surface information.

14. The process of claim 13, wherein the surface comprises a ball grid array surface, a flip chip die surface, or a heat sink surface.

15. The process of claim 13, wherein the tactile electroluminescent sensor array comprises nanoparticle layers configured to interact with the localized stress.

16. The process of claim 13, wherein capturing variations in electroluminescent and/or electrical signal intensity comprises providing optical communication with a charge coupled device detector.

17. The process of claim 13, wherein capturing variations in electrical signal intensity comprises providing electrical communication with an electronic signal processor.

18. A process for inspecting a surface during device manufacture on a substrate, the process comprising:

mapping the surface by contacting the surface with a planar surface of a current sensing electrode tactile sensor array comprising a plurality of discrete electrode arrays;

capturing variations in current as a function of localized stress caused by contacting the surface with the current sensing electrode tactile sensor arrays, wherein the variations provide topographical surface information; and integrating information obtained during the mapping with a robot and manipulating a position of a surface mounted package relative to the substrate.

19. The process of claim 18, wherein the surface comprises a ball grid array surface, a flip chip die surface, or a heat sink surface.

20. The process of claim 18, further comprising determining missing, low, high or oversized features from the topographical surface information.

21. The process of claim 18, wherein the current variations are proportional to the local stress.

22. The process of claim 18, wherein the surface comprises an interconnect array.

* * * * *